United States Patent
Nebuya

(10) Patent No.: US 12,032,049 B2
(45) Date of Patent: Jul. 9, 2024

(54) MEASUREMENT APPARATUS, DETECTION APPARATUS, AND MEASUREMENT METHOD

(71) Applicant: ASAHI INTECC CO., LTD., Seto (JP)

(72) Inventor: Satoru Nebuya, Tokyo (JP)

(73) Assignee: ASAHI INTECC CO., LTD., Seto (JP)

( * ) Notice: Subject to any disclaimer, the term of this patent is extended or adjusted under 35 U.S.C. 154(b) by 235 days.

(21) Appl. No.: 17/860,635

(22) Filed: Jul. 8, 2022

(65) Prior Publication Data
US 2022/0342019 A1 Oct. 27, 2022

Related U.S. Application Data

(63) Continuation of application No. PCT/JP2020/001021, filed on Jan. 15, 2020.

(51) Int. Cl.
*G01R 33/561* (2006.01)
*G01R 33/56* (2006.01)

(52) U.S. Cl.
CPC ....... *G01R 33/561* (2013.01); *G01R 33/5608* (2013.01)

(58) Field of Classification Search
CPC .............. G01R 33/561; G01R 33/5608; G01R 33/3806; G01R 33/583; G01R 33/323; G01R 33/445
See application file for complete search history.

(56) References Cited

U.S. PATENT DOCUMENTS

| 10,393,834 B2 * | 8/2019 | Kuratani .............. G01R 33/546 |
| 2008/0246472 A1 | 10/2008 | Igney et al. |
| 2012/0013332 A1 | 1/2012 | Honkura et al. |
| 2016/0069975 A1 * | 3/2016 | Rothberg ................. H01F 7/06 324/322 |

(Continued)

FOREIGN PATENT DOCUMENTS

| EP | 2 413 153 A1 | 2/2012 |
| EP | 3 333 582 A1 | 6/2018 |

(Continued)

OTHER PUBLICATIONS

Kumagai, H. et al. "Current Induced Magnetic Tomography," Japan Academic Association for Copyright Clearance, Inc., OQD-15-003, pp. 13-16, Jan. 26, 2015.

*Primary Examiner* — Giovanni Astacio-Oquendo
(74) *Attorney, Agent, or Firm* — Oliff PLC

(57) ABSTRACT

A measurement apparatus that includes a static magnetic field application part that applies a static magnetic field in a first direction to a measurement subject, a deflection magnetic field application part that applies a deflection magnetic field in a second direction different, to a portion of the measurement subject via a coil, a plurality of magnetic field detection elements respectively detect a magnitude of a magnetic field on the basis of an electromagnetic wave generated and propagated in a portion of the measurement subject due to an application of the deflection magnetic field, a calculation part that calculates an impedance distribution of at least a portion of a region where the electromagnetic wave is propagated inside the measurement subject, and an image information output part that generates and outputs an image showing information about inside the measurement subject.

17 Claims, 5 Drawing Sheets

(56) References Cited

U.S. PATENT DOCUMENTS

| | | |
|---|---|---|
| 2016/0091448 A1 | 3/2016 | Soleimani |
| 2016/0238673 A1 | 8/2016 | Honkura |
| 2018/0210040 A1 | 7/2018 | Shimoto et al. |
| 2021/0172739 A1* | 6/2021 | Roelver ................. G01C 19/04 |

FOREIGN PATENT DOCUMENTS

| | | |
|---|---|---|
| EP | 3 407 079 A2 | 11/2018 |
| JP | 2009-506855 A | 2/2009 |
| JP | 2016-000095 A | 1/2016 |
| JP | 5839527 B1 | 1/2016 |
| JP | 2016-524138 A | 8/2016 |
| JP | 6506466 B1 | 4/2019 |

* cited by examiner

MEASUREMENT APPARATUS, DETECTION APPARATUS, AND MEASUREMENT METHOD

CROSS-REFERENCE TO RELATED APPLICATIONS

This application is a continuation application of International Application number PCT/JP2020/001021, filed on Jan. 15, 2020. The contents of this application are incorporated herein by reference in their entirety.

TECHNICAL FIELD

This application relates to a measurement apparatus, a detection apparatus, and a measurement method for measuring information about inside a measurement subject.

BACKGROUND

Magnetic resonance imaging (MRI) is a technique that uses a nuclear magnetic resonance phenomenon to output information about inside a living body as a tomographic image. In addition, a compact and highly sensitive magnetic sensor is known (see, for example, Patent Document 1: Japanese Patent Nos. 6506466 and 5839527).

MRI applies a static magnetic field from outside to a body that is a measurement subject to macroscopically magnetize the body. Since this causes atoms constituting the living body to undergo precessional motion, irradiation with pulses of electromagnetic waves having a frequency that coincides with the Larmor frequency of said precessional motion causes a resonance, thereby changing a rotation frequency of said precessional motion (nuclear magnetic resonance phenomenon). Then, the precessional motion of the atoms returns to a steady state when the irradiation of the pulses of electromagnetic waves is stopped. A process of returning to the steady state (relaxation phenomenon) differs from an atom to an atom, and so MRI generates an image of such a difference in the relaxation phenomenon and outputs the image as a tomographic image of the living body.

Thus, since MRI observes the relaxation phenomenon until the precession motion of the atoms returns to the steady state, a measurement result could not be outputted until at least the relaxation time elapsed. On the other hand, in order to detect an abnormality in a living body, it is desirable to acquire a plurality of tomographic images at different positions of the living body to make a diagnosis, and it could take several tens of minutes to an hour or more of measurement time just to determine whether a portion of the body is normal or abnormal.

SUMMARY

The disclosed embodiments focus on this point, and an object thereof is to enable high-speed acquisition of information about inside a living body with a simple configuration.

A first aspect of the present disclosure provides a measurement apparatus including a static magnetic field application part that applies a static magnetic field of a constant magnitude in a first direction to a measurement subject, a deflection magnetic field application part that applies a deflection magnetic field having a predetermined frequency in a second direction different from the first direction, to a portion of the measurement subject via a coil, a plurality of magnetic field detection elements that are arranged around the measurement subject and respectively detect a magnitude of a magnetic field on the basis of an electromagnetic wave generated and propagated in a portion of the measurement subject due to an application of the deflection magnetic field, a calculation part that calculates an impedance distribution of at least a portion of a region where the electromagnetic wave is propagated inside the measurement subject, on the basis of detection results of the plurality of magnetic field detection elements, and an image information output part that generates and outputs an image showing information about inside the measurement subject on the basis of the impedance distribution.

A second aspect of the present disclosure provides a detection apparatus provided in an MR image measurement apparatus, wherein the MR image measurement apparatus includes a static magnetic field application part that applies a static magnetic field of a constant magnitude in a first direction, to a measurement subject, a deflection magnetic field application part that applies a deflection magnetic field having a predetermined frequency in a second direction different from the first direction toward a portion of the measurement subject via a coil, a relaxation detection element that detects an electromagnetic wave generated due to an application of the deflection magnetic field and a relaxation phenomenon of the generated electromagnetic wave, in a portion of the measurement subject, and an MR image generation part that generates and outputs a magnetic resonance image that is a tomographic image inside the measurement subject, on the basis of a detection result of the relaxation detection element, wherein the detection apparatus includes a plurality of magnetic field detection elements that are arranged around the measurement subject and respectively detect a magnitude of a magnetic field on the basis of an electromagnetic wave generated and propagated in a portion of the measurement subject due to an application of the deflection magnetic field, a calculation part that calculates an impedance distribution of at least a portion of a region where the electromagnetic wave is propagated inside the measurement subject, on the basis of detection results of the plurality of magnetic field detection elements, and an image information output part that generates and outputs an image showing information about inside the measurement subject, on the basis of the impedance distribution.

A third aspect of the present disclosure provides a measurement method including the steps of applying a static magnetic field of a constant magnitude in a first direction, to a measurement subject, applying a deflection magnetic field having a predetermined frequency in a second direction different from the first direction, to a portion of the measurement subject via a coil, detecting a magnitude of a magnetic field on the basis of an electromagnetic wave generated and propagated in a portion of the measurement subject due to an application of the deflection magnetic field, around the measurement subject, calculating an impedance distribution of at least a portion of a region where the electromagnetic wave is propagated inside the measurement subject, on the basis of a detection result of the propagated electromagnetic wave, and generating and outputting an image showing information about inside the measurement subject, on the basis of the impedance distribution.

DETAILED DESCRIPTION

Hereinafter, the disclosed embodiments will be described through exemplary embodiments, but the disclosure is not intended to be limited to the following exemplary embodiments and not all of the combinations of features described in the exemplary embodiments are necessarily essential to the solution means disclosed herein.

Configuration Example of Measurement Apparatus 100

Figure 1:
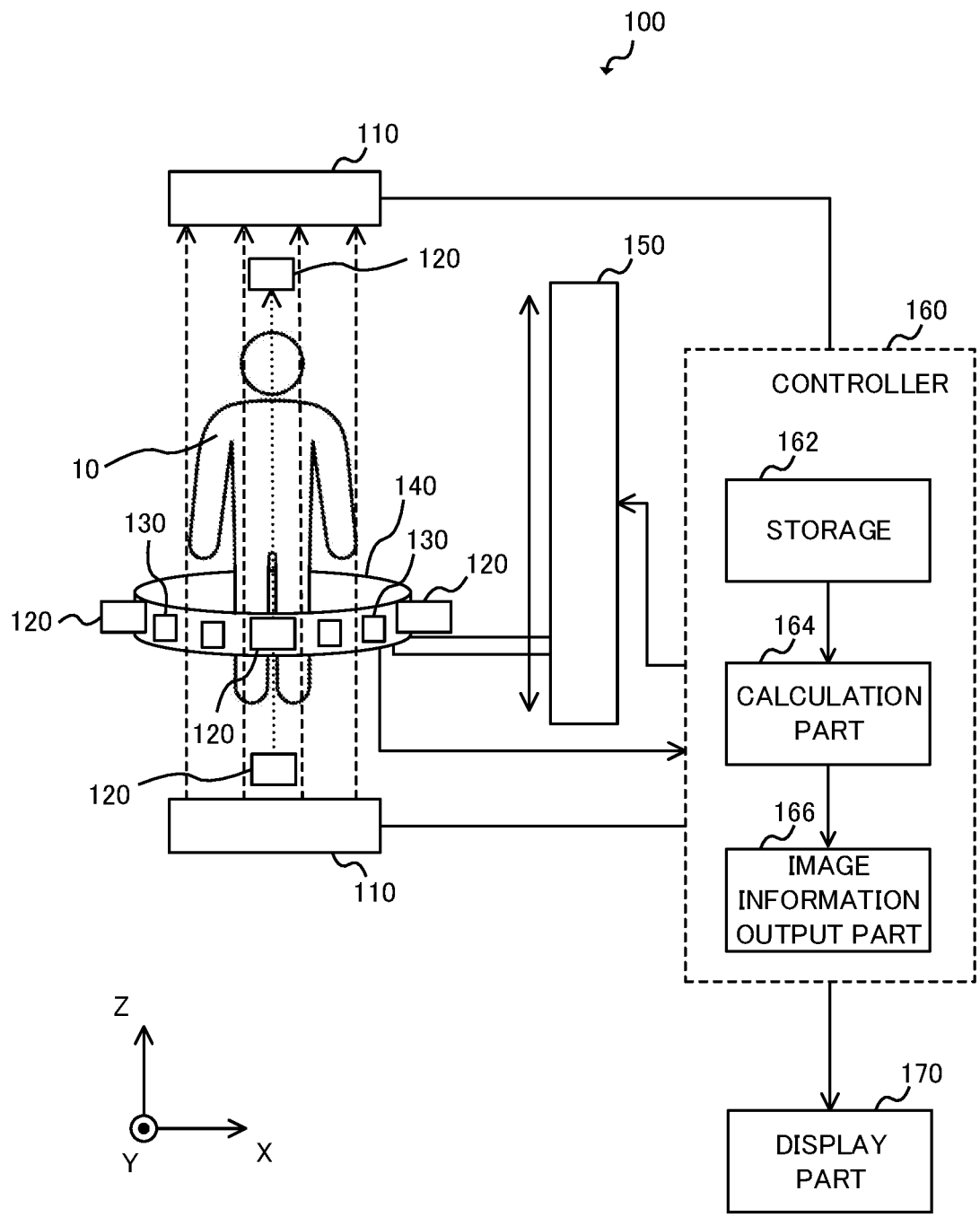
FIG. 1 shows a configuration example of a measurement apparatus 100 according to the present embodiment together with a measurement subject 10.

FIG. 1 shows a configuration example of a measurement apparatus 100 according to the present embodiment together with a measurement subject 10. The measurement apparatus 100 outputs information about inside the measurement subject 10 as a tomographic image. The measurement apparatus 100 applies a deflection magnetic field to the measurement subject 10 that is being applied with a static magnetic field, and acquires the information about inside the measurement subject 10 on the basis of an electromagnetic wave generated in response to an application of the deflection magnetic field. The measurement subject 10 is a living body such as a human body, for example. In the present embodiment, an example in which the measurement subject 10 is a human body will be described. The measurement apparatus 100 includes a static magnetic field application part 110, a deflection magnetic field application part 120, a magnetic field detection element 130, an accommodation part 140, a moving part 150, a controller 160, and a display part 170.

The static magnetic field application part 110 applies the static magnetic field of a constant magnitude in a first direction, to the measurement subject 10. FIG. 1 shows an example in which the human body as the measurement subject 10 stands upright on a ground parallel to an XY plane. In FIG. 1, the first direction is shown as a direction substantially parallel to a Z direction. Here, the Z direction is a direction perpendicular to the ground, and is a height direction of the human body. For example, the static magnetic field application part 110 applies the static magnetic field having a magnitude of several T (tesla) that is equivalent to the magnitude of the static magnetic field used in MRI and the like, to the entire measurement subject 10. Further, the static magnetic field application part 110 may apply the static magnetic field having a magnitude of less than several T. For example, the static magnetic field application part 110 applies the static magnetic field having a magnitude of 100 μT or more that is larger than the magnitude of geomagnetism, to the measurement subject 10. The static magnetic field application part 110 includes a Helmholtz coil, for example.

The deflection magnetic field application part 120 applies the deflection magnetic field, having a predetermined frequency, in a second direction different from the first direction, to a portion of the measurement subject 10 via a coil. Here, the predetermined frequency is determined on the basis of the magnitude of the static magnetic field outputted from the static magnetic field application part 110, and is a frequency of about several kHz to several hundred kHz, for example.

Further, the second direction is defined on the basis of a region to be observed of the measurement subject 10, and is one or more directions different from the first direction. The deflection magnetic field application part 120 applies one or more deflection magnetic fields directed in the one or more directions different from the first direction, toward a portion of the measurement subject 10, for example.

The deflection magnetic field application part 120 includes one or more magnetic field generation coils. The magnetic field generation coil is a Helmholtz coil, for example. It is desirable that the deflection magnetic field application part 120 is capable of applying the deflection magnetic field in various directions to the measurement subject 10. At least six deflection magnetic field application parts 120 are provided such that the deflection magnetic field can be applied in six directions, for example, ±X direction, ±Y direction, and ±Z direction.

In this case, the six deflection magnetic field application parts 120 are desirable to be arranged such that the magnitude of the deflection magnetic field outputted from each of the six deflection magnetic field application parts 120 are controlled, thereby applying the deflection magnetic fields of various magnitudes and directions, to any portion of the measurement subject 10. In addition, each of the deflection magnetic field application parts 120 may be movable such that the deflection magnetic fields can be applied to various portions of the measurement subject 10.

The magnetic field detection elements 130, arranged around the measurement subject 10, respectively detect the magnitudes of the magnetic fields on the basis of the electromagnetic waves generated and propagated in the portions of the measurement subject 10 due to the application of the deflection magnetic fields. A plurality of magnetic field detection elements 130 are desirable to be arranged in a plurality of positions to surround the measurement subject 10. The magnetic field detection element 130 is a highly sensitive magnetic sensor capable of detecting a weak magnetic field in units of nT (nanotesla), pT (picotesla), and fT (femtotesla), for example.

The accommodation part 140 accommodates at least some of the deflection magnetic field application parts 120. The accommodation part 140 has a ring shape or a partial ring shape surrounding the measurement subject 10, and accommodates a plurality of deflection magnetic field application parts 120, for example. Further, the accommodation part 140 accommodates at least some of the plurality of magnetic field detection elements 130. FIG. 1 shows an example in which some of the deflection magnetic field application parts 120 and all the magnetic field detection elements 130 are accommodated by the accommodation part 140.

With such an accommodation part 140, the plurality of deflection magnetic field application parts 120 can apply the plurality of deflection magnetic fields directed in a plurality of directions different from the first direction to a portion of the measurement subject 10. In addition, the plurality of magnetic field detection elements 130 can detect the magnetic fields generated in the plurality of directions due to the application of the plurality of deflection magnetic fields.

The moving part 150 moves the accommodation part 140 in a predetermined direction while maintaining the directions of the deflection magnetic fields generated by the plurality of deflection magnetic field application parts 120 with respect to the measurement subject 10. The moving part 150 moves the accommodation part 140 in a parallel or perpendicular direction relative to the measurement subject 10. FIG. 1 shows an example in which the moving part 150 moves the accommodation part 140 in the first direction. It is desirable that the moving part 150 can move the accommodation part 140 such that the deflection magnetic field can be applied to a designated portion of the human body from the toes to the crown of the head. Further, the moving part 150 may move the accommodation part 140 such that the accommodation part 140 rotates around the measurement subject 10.

It should be noted that the accommodation part 140 may have a cylindrical shape surrounding the measurement subject 10. The accommodation part 140 has a cylindrical shape extending in the first direction, for example. In this case, the deflection magnetic field application parts 120 and the magnetic field detection elements 130 may be provided at a plurality of different positions on the accommodation part 140. For example, when the accommodation part 140 is large enough to cover the measurement subject 10, it is desirable that the plurality of deflection magnetic field application parts 120 are arranged such that the deflection magnetic field can be applied to a designated portion of the human body from the toes to the crown of the head. As an example, the cylindrical accommodation part 140 has a plurality of ring shapes or partial ring shapes surrounding the measurement subject 10. In this case, the moving part 150 may be omitted because the deflection magnetic field can be applied to any portion of the measurement subject 10 without moving the accommodation part 140.

The controller 160 controls the operations of the static magnetic field application part 110, the deflection magnetic field application part 120, the magnetic field detection element 130, the accommodation part 140, and the moving part 150. The controller 160 controls timing of applying the static magnetic field by the static magnetic field application part 110 and timing of applying the deflection magnetic field by the deflection magnetic field application part 120, for example. The controller 160 controls detection timing of the magnetic field detection element 130. Further, the controller 160 controls the moving part 150 to move the accommodation part 140. In addition, the controller 160 acquires a detection result detected by the magnetic field detection element 130. The controller 160 generates a tomographic image of the measurement subject 10 on the basis of the acquired detection result. The controller 160 is a computer such as a server, for example.

Configuration Examples of Accommodation Part 140 and Controller 160

Figure 2:
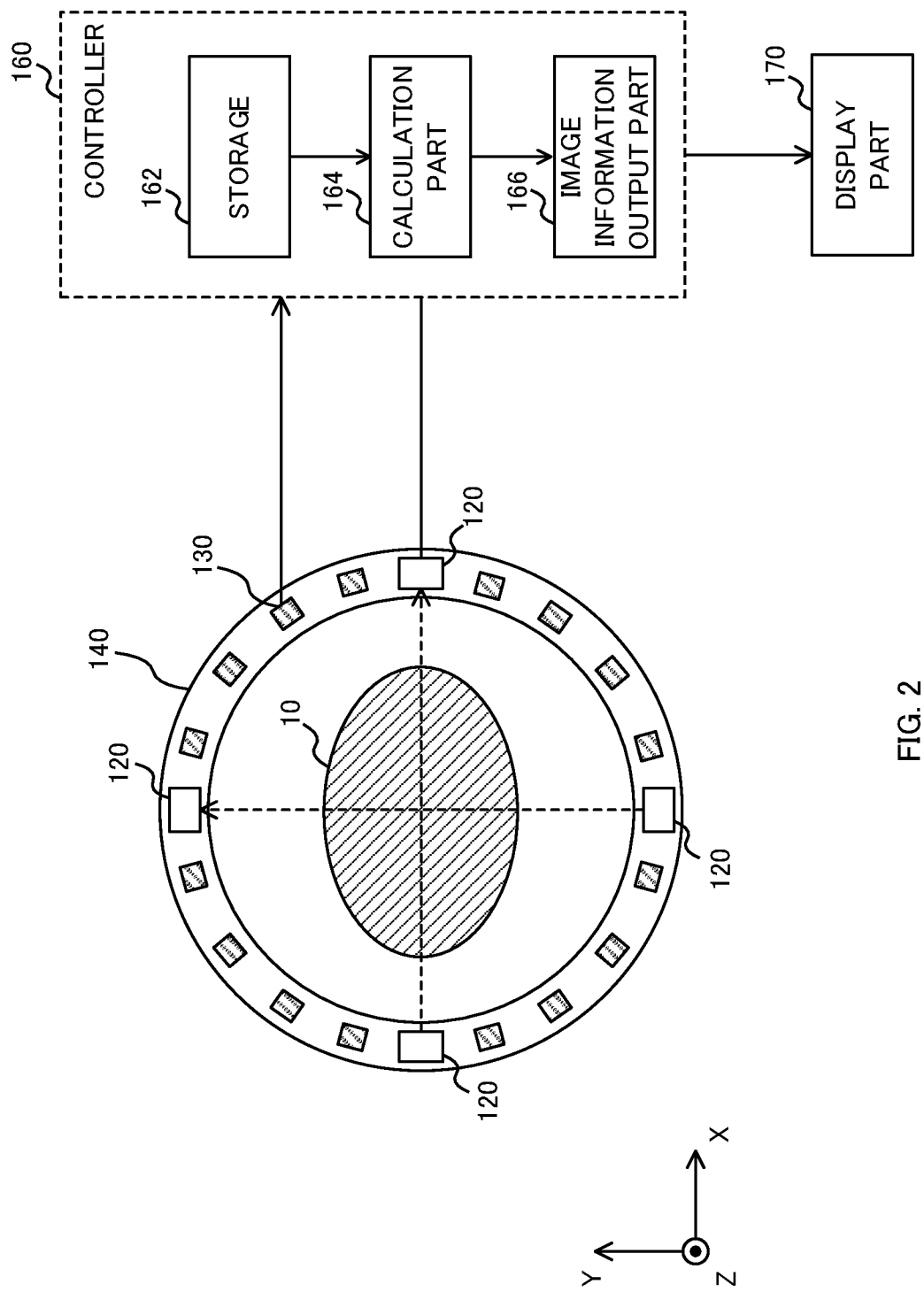
FIG. 2 shows configuration examples of an accommodation part 140 and a controller 160 according to the present embodiment together with the measurement subject 10.

FIG. 2 shows configuration examples of the accommodation part 140 and the controller 160 according to the present embodiment together with the measurement subject 10. The accommodation part 140 and the measurement subject 10 in FIG. 2 show a configuration example of a cross section of the measurement apparatus 100 in a plane parallel to the XY plane in FIG. 1. As described with reference to FIG. 1, the accommodation part 140 accommodates the plurality of deflection magnetic field application parts 120 and the plurality of magnetic field detection elements 130.

In the accommodation part 140, the deflection magnetic field application parts 120 and the magnetic field detection elements 130 are provided at predetermined intervals along the circumferential direction of the ring shape, for example.

The deflection magnetic field application part 120 is arranged to apply the deflection magnetic field in a predetermined direction. Further, the magnetic field detection element 130 is arranged to detect the magnetic field generated in the measurement subject 10.

The controller 160 causes the deflection magnetic field application part 120 to apply the deflection magnetic field to the measurement subject 10 while causing the static magnetic field application part 110 to apply the static magnetic field to the measurement subject 10. Thus, the deflection magnetic field is applied in a state where the measurement subject 10 is macroscopically magnetized. Therefore, similarly to the operation of MRI, a nuclear magnetic resonance phenomenon occurs when the frequency of the deflection magnetic field coincides with the Larmor frequency of precession motion of atoms constituting the measurement subject 10. That is, a rotation frequency of the precessional motion of the atoms constituting the measurement subject 10 irradiated with the deflection magnetic field changes. Due to such a change in the precessional motion, the atoms irradiated with the deflection magnetic field generate the electromagnetic wave different from that in the steady state.

Whether or not such nuclear magnetic resonance of the atoms occurs is determined depending on the type of atoms, the density of atoms, the magnitude of static magnetic field, the frequency of deflection magnetic field, and the like. For example, if the magnitude of the static magnetic field is about 0.1 T to 2 T that is about a magnetic field intensity used in MRI, the nuclear magnetic resonance of hydrogen atoms in the human body can be generated by setting the frequency of the deflection magnetic field to about several hundred kHz. Further, if the magnitude of the static magnetic field is about the intensity of the geomagnetism of several tens of μT, the nuclear magnetic resonance of hydrogen atoms in the human body can be generated by setting the frequency of the deflection magnetic field to about several kHz.

The magnetic field detection element 130 detects a magnetic field component of the electromagnetic wave generated in response to such nuclear magnetic resonance. The deflection magnetic field application part 120 applies the deflection magnetic field to a local portion of the measurement subject 10, for example. An eddy current corresponding to the deflection magnetic field is generated at the local portion of the measurement subject 10. The eddy current is a current of a magnitude corresponding to the impedance of the local portion. Then, the magnetic field corresponding to the generated eddy current is generated. The magnetic field detection element 130 detects the magnitude of the magnetic field generated in this manner. In this way, the magnitude of the magnetic field detected by the magnetic field detection element 130 is a value based on the electromagnetic wave propagated under the influence of the electrical characteristics of a path from the portion where the deflection magnetic field is applied to the magnetic field detection element 130. Here, the electrical characteristics of the path from the portion where the deflection magnetic field is applied to the magnetic field detection element 130 is the impedance of an internal organ or an organ of the human body, for example.

That is, the magnitude of the magnetic field detected by the magnetic field detection element 130 corresponds to the information about inside the human body through which the electromagnetic wave has passed. Therefore, the controller 160 controls the magnitude of the magnetic field outputted by the deflection magnetic field application part 120 to apply the deflection magnetic field to a plurality of portions of the measurement subject 10, and acquires the detection result of the magnetic field detection element 130 for each portion to which the deflection magnetic field is applied. Thus, the controller 160 can acquire the detection result of the magnetic field corresponding to an impedance distribution inside the measurement subject 10. By analyzing such a detection result, the controller 160 can generate an image of the information about inside the measurement subject 10. The controller 160 described above includes a storage 162, a calculation part 164, and an image information output part 166, for example.

The storage 162 stores the detection result detected by the magnetic field detection element 130. Further, the storage 162 may store each of intermediate data, a calculation result, a threshold value, a parameter, and the like that are generated (or used) by the measurement apparatus 100 in the course of operation. In addition, the storage 162 may supply the stored data to a requester in response to a request from each unit in the measurement apparatus 100.

The storage 162 may store information such as an Operating System (OS) and a program that allow the server or other device to function as the controller 160. Further, the storage 162 may store various types of information, including a database that is referenced when executing the program. For example, a computer such as a server functions as at least some of the storage 162, the calculation part 164, and the image information output part 166 by executing the program stored in the storage 162.

The storage 162 includes a Read Only Memory (ROM) for storing Basic Input Output System (BIOS) and the like of a computer or the like, and a Random Access Memory (RAM) serving as a work area, for example. Further, the storage 162 may include a large-capacity storage device such as a hard disk drive (HDD) and/or a solid state drive (SSD). Furthermore, the computer may further include a Graphics Processing Unit (GPU) and the like.

The calculation part 164 calculates the impedance distribution of at least a portion of the region where the electromagnetic wave is propagated inside the measurement subject 10, on the basis of the plurality of detection results of the magnetic field detection elements 130. The calculation part 164 compares and analyzes the magnitude of the magnetic field of each of the electromagnetic waves propagated from the plurality of portions to calculate the impedance between the plurality of portions, for example. The calculation part 164 calculates the impedance distribution inside the human body using two-dimensional Fourier transform or the like, for example.

The image information output part 166 generates and outputs the image showing the information about inside the measurement subject 10, on the basis of the impedance distribution. The calculation part 164 and the image information output part 166 generate the tomographic image of the inside of the human body using an image reconstruction method known as computer tomography. It should be noted that the image reconstruction method is a known technique, therefore a detailed description thereof will be omitted here. Further, the image information output part 166 may generate a three-dimensional image on the basis of the two-dimensional tomographic image. The image information output part 166 displays the generated image on a display device or the like. The image information output part 166 may store the generated image in the storage 162. In addition, the image information output part 166 may store the generated image in an external database or the like via a network or the like.

As described above, the measurement apparatus 100 according to the present embodiment can output the impedance distribution inside of a living body, such as a human body, as a tomographic image. Since the impedance of the inside of the human body differs depending on an internal organ, an organ, and the like, a condition and the like of the inside of the human body can be easily confirmed using the tomographic image outputted by the measurement apparatus 100.

The above measurement apparatus 100 applies the static magnetic field and the deflection magnetic field to the measurement subject 10 to generate the nuclear magnetic resonance phenomenon, and detects the electromagnetic wave based on the generation of said nuclear magnetic resonance phenomenon. Such a measurement apparatus 100 calculates the impedance distribution without observing the relaxation phenomenon until the nuclear magnetic resonance phenomenon returns to the steady state as in MRI or the like, such that the tomographic image inside the measurement subject 10 can be outputted at a higher speed. In addition, a tumor such as cancer that develop in the internal organ or the like may change the impedance different from the impedance of the organ. Therefore, by using the measurement apparatus 100, it is possible to easily observe and distinguish a normal condition, an abnormal condition, and the like of the organ, which are difficult to observe with MRI.

As described above, the measurement apparatus 100 detects the electromagnetic wave propagated in response to the nuclear magnetic resonance phenomenon generated inside the measurement subject 10, and outputs the information about inside the measurement subject 10 as an image. Therefore, if the electromagnetic wave can be detected, the magnitude of the static magnetic field applied to the measurement subject 10 by the static magnetic field application part 110 may be smaller than the magnitude of the static magnetic field of several T used by MRI or the like.

In this case, the magnitude of the magnetic field to be detected by the magnetic field detection element 130 is smaller in proportion to the magnitude of the static magnetic field. However, since a highly sensitive magnetic sensor is known, such as that mentioned in Patent Documents 1 and 2, the magnitude of the static magnetic field outputted by the static magnetic field application part 110 can be reduced from mT to a few hundred $\mu$T. This allows the measurement apparatus 100 to output the tomographic image of the inside of the measurement subject 10 inexpensively with a small device, without using an expensive and large magnetic field generator that generates a strong magnetic field of several T.

It is also known that a highly sensitive magnetic sensor, such as an optical pumping magnetometer and a superconducting quantum interference device (SQUID), or the like have high sensitivity in units of about fT or less, for example. Thus, if the highly sensitive magnetic sensor capable of detecting a weak magnetic field in units of pT or less is used as the magnetic field detection element 130, the magnitude of the static magnetic field outputted by the static magnetic field application part 110 can be made smaller.

For example, the static magnetic field application part 110 may make the magnitude of the static magnetic field to be outputted smaller to about the same magnitude as the geomagnetism. In this case, the measurement apparatus 100 may use the geomagnetism as the static magnetic field in the first direction of a constant magnitude. The deflection magnetic field application part 120 applies the deflection magnetic field in the second direction that is different from the first direction, the direction of the magnetic field of the geomagnetism, to a portion of the measurement subject 10 that is magnetized by the geomagnetism.

Such a measurement apparatus 100 may omit the static magnetic field application part 110, allowing the size of the apparatus to be smaller. It should be noted that the measurement apparatus 100 may further include a fixing part that can move the measurement subject 10 that is fixed to the fixing part, such that the first direction that is the direction of geomagnetism is aligned with the predetermined direction of the measurement subject 10. Further, such a fixing part may include a bed or the like such that the human body can be fixed in a lying state.

The example of the measurement apparatus 100 according to the present embodiment in which the static magnetic field application part 110 applies the static magnetic field of a constant magnitude to the measurement subject 10 has been described above, but the present disclosure is not limited thereto. In addition to this, the static magnetic field application part 110 may be configured to change the magnitude of the static magnetic field to be applied to the measurement subject 10.

As mentioned above, the resonance frequency at which nuclear magnetic resonance occurs in the measurement subject 10 changes depending on the type of atom, the magnitude of the static magnetic field, and the like. Thus, when the static magnetic field application part 110 changes the magnitude of the static magnetic field to be applied to the measurement subject 10, the resonance frequency with respect to the atoms included in the measurement subject 10 can be changed. Therefore, the controller 160 acquires the detection result from the magnetic field detection element 130 for each magnitude of the static magnetic fields outputted by the static magnetic field application part 110. In this way, the calculation part 164 calculates the impedance distribution for each magnitude of the static magnetic fields.

Thus, the measurement apparatus 100 can measure the frequency characteristics of the impedance distribution by sweeping the magnitude of the static magnetic field over a predetermined magnitude range. The frequency characteristics of the impedance distribution can be expressed with a horizontal axis representing the frequency and a vertical axis representing a value of the impedance of one or more portions, for example. Alternatively, the tomographic image of the impedance distribution may be generated for each of a plurality of resonance frequencies as the frequency characteristics of the impedance distribution. By measuring the frequency characteristics of the impedance distribution, it is possible to determine the occurrence of nuclear magnetic resonance of a plurality of different atoms, for example, and more detailed information about inside the measurement subject 10 can be acquired.

The measurement apparatus 100 according to the present embodiment described above detects the electromagnetic wave on the basis of the occurrence of the nuclear magnetic resonance phenomenon, but the present disclosure is not limited thereto. Since the measurement apparatus 100 can generate the nuclear magnetic resonance phenomenon inside the measurement subject 10, it is also possible to observe the relaxation phenomenon until the nuclear magnetic resonance phenomenon returns to the steady state as in MRI or the like. Such a measurement apparatus 100 will be described next.

Variation of Measurement Apparatus 100

Figure 3:
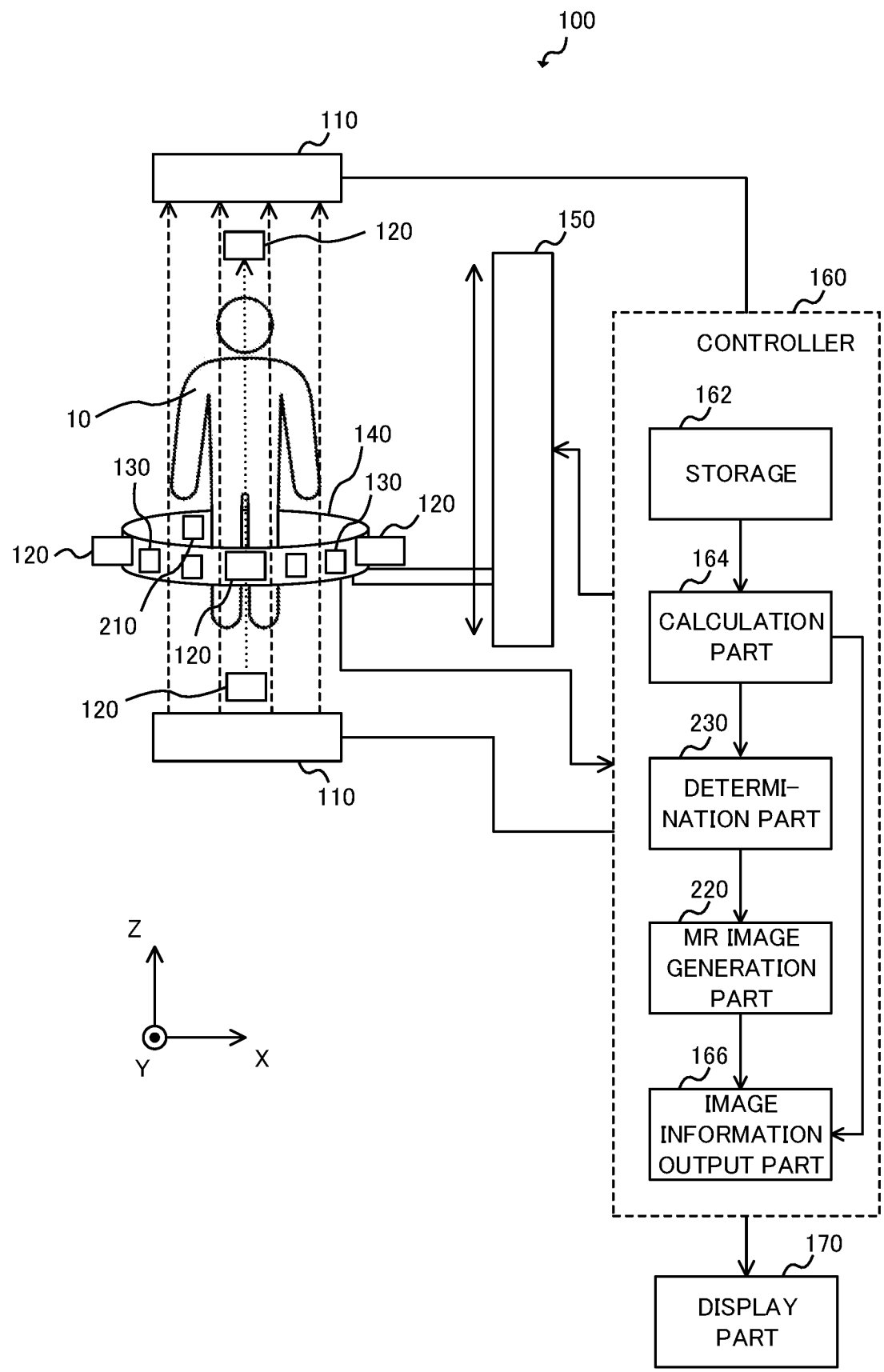
FIG. 3 shows a variation of the measurement apparatus 100 according to the present embodiment together with the measurement subject 10.

FIG. 3 shows a variation of the measurement apparatus 100 according to the present embodiment together with the measurement subject 10. In this variation of the measurement apparatus 100, units that are identical to those of the measurement apparatus 100 of the present embodiment shown in FIGS. 1 and 2 have the same reference numerals, and the description thereof will be omitted. The measurement apparatus 100 of this variation includes a relaxation detection element 210, an MR image generation part 220, and a determination part 230.

The relaxation detection element 210 detects the relaxation phenomenon of the electromagnetic wave generated by applying the deflection magnetic field to a portion of the measurement subject 10. The relaxation detection element 210 is a detection element similar to the magnetic field detection element 130, for example. Further, one or more magnetic field detection elements 130 among the plurality of magnetic field detection elements 130 may further detect the process from the detection of the magnetic field until the magnitude of said magnetic field returns to the steady state, to function as the relaxation detection element 210. It should be noted that the relaxation phenomenon of the electromagnetic wave is known in the MRI measurement, and so the description thereof will be omitted here. The controller 160 acquires the detection result of the relaxation phenomenon of the magnetic field detection element 130.

The MR image generation part 220 generates and outputs a magnetic resonance image, a tomographic image of the inside of the measurement subject 10, on the basis of such a detection result of the relaxation detection element 210. The MR image generation part 220 generates the magnetic resonance image of the inside of the human body using the image reconstruction method known as the computed tomography, for example. It should be noted that the image reconstruction method is a known technique, and so a detailed description thereof will be omitted here. This allows the measurement apparatus 100 to output the magnetic resonance image without generating a strong magnetic field of several T and with an equipment smaller than that used in conventional MRI.

Thus, the measurement apparatus 100 is configured to be able to generate the tomographic image of the impedance distribution of the measurement subject 10 and the magnetic resonance image of the measurement subject 10. In this case, the measurement apparatus 100 is desirable to be configured to be capable of switching (i) generating the tomographic image of the impedance distribution of the measurement subject 10 and (ii) generating the magnetic resonance image of the measurement subject 10. Further, the measurement apparatus 100 is more preferable to be configured such that the portion where the magnetic resonance image is to be generated can be designated on the basis of a generation result of the tomographic image of the impedance distribution. In this case, the controller 160 includes the determination part 230.

The determination part 230 determines a portion inside the measurement subject 10 where the magnetic resonance image is to be generated, on the basis of one or more images showing the information about inside the measurement subject 10 generated by the image information output part 166. Since the tomographic image of the impedance distribution of the measurement subject 10 can be generated at high speed as described above, said tomographic image can be used to determine the portion where the magnetic resonance image is generated, for example. In this case, the determination part 230 may use the generation results of the plurality of tomographic images to determine the portion where the magnetic resonance image of the measurement subject 10 to be generated.

The determination part 230 determines a portion estimated to have an abnormality in the tomographic image as the portion where the magnetic resonance image is to be generated, on the basis of image processing such as image comparison, for example. Alternatively, the determination part 230 may receive an input of the portion where the magnetic resonance image is to be generated, from the user or the like, after the image information output part 166 displays the generation results of the plurality of tomographic images on the display part 170. The operation of such a measurement apparatus 100 will be described next.

Example of Operation of Measurement Apparatus 100

Figure 4:
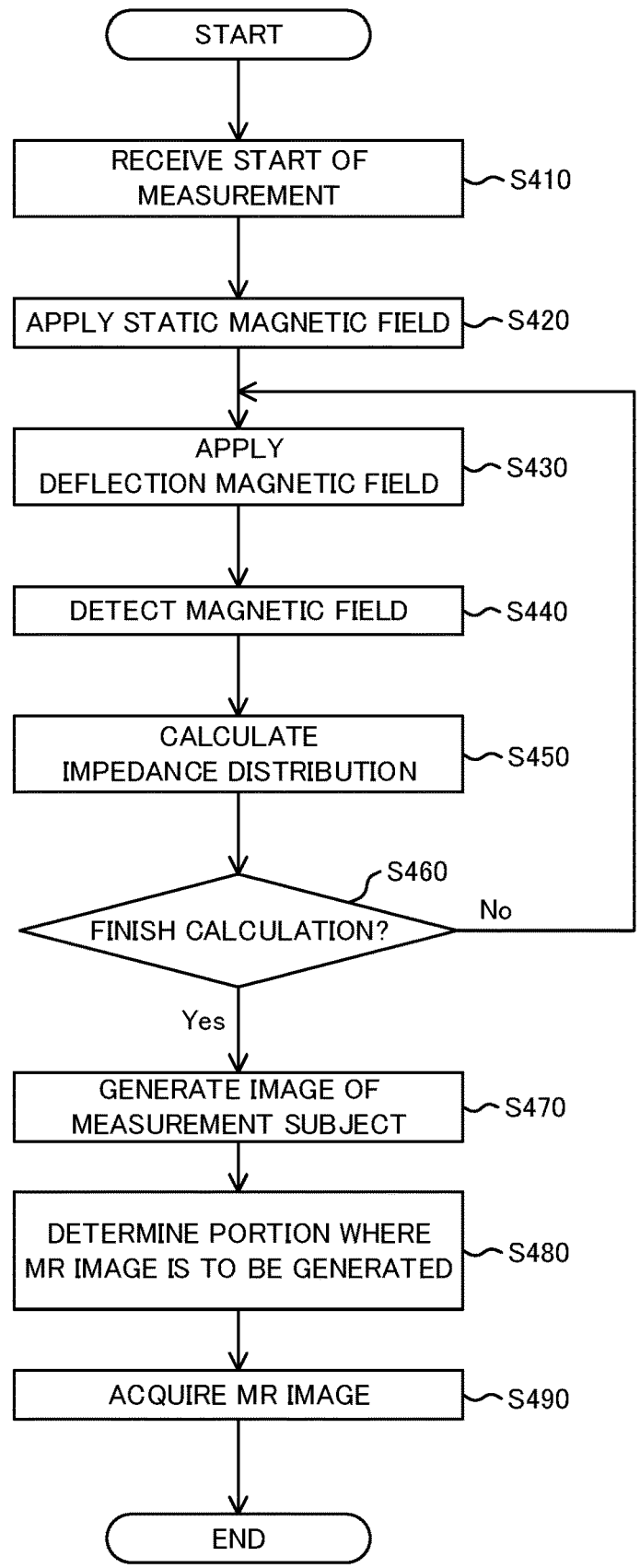
FIG. 4 shows an example of an operation of the measurement apparatus 100 of the present variation shown in FIG. 3.

FIG. 4 shows an example of the operation of the measurement apparatus 100 of the present variation shown in FIG. 3. The measurement apparatus 100 outputs the magnetic resonance image of the measurement subject 10 by executing the operation from S410 to S490.

First, the controller 160 receives the start of measurement of the measurement subject 10 from the user or the like (step S410). Here, the measurement subject 10 is assumed to be arranged so as to have a predetermined positional relationship with respect to the static magnetic field application part 110, the deflection magnetic field application part 120, and the magnetic field detection element 130. Further, the controller 160 further receives information and the like about the measurement range of the measurement subject 10. The controller 160 receives an instruction for the measurement range such as a head, neck, chest, abdomen, waist, leg, whole body, or the like. The controller 160 controls the moving part 150 to move the accommodation part 140 to a measurement start point of the measurement range in accordance with the received information.

Next, the static magnetic field application part 110 applies the static magnetic field of the constant magnitude in the first direction to the measurement subject 10 (step S420). The static magnetic field application part 110 applies the static magnetic field of a predetermined intensity level to the measurement subject 10.

Next, the deflection magnetic field application part 120 applies the deflection magnetic field with the predetermined frequency in the second direction different from the first direction to the portion of the measurement subject 10 (step S430). The deflection magnetic field application part 120 applies the deflection magnetic field to a portion of the measurement subject 10 corresponding to the received measurement range. The plurality of magnetic field detection elements 130 respectively detect, around the measurement subject 10, the magnitudes of the magnetic fields based on the electromagnetic wave generated and propagated in the portion of the measurement subject 10 due to the application of the deflection magnetic field (step S440).

Next, the calculation part 164 calculates the impedance distribution of at least a portion of the region where the electromagnetic wave is propagated inside the measurement subject 10, on the basis of the detection result of the propagated electromagnetic wave (step S450). The controller 160 repeats the operation from S430 to S450 until the calculation of the impedance distribution of the measurement range is finished (step S460: No). Here, the controller 160 changes the portion to which the deflection magnetic field is applied to calculate the impedance distribution for each portion to which the deflection magnetic field is applied, for example. It should be noted that the controller 160 may control the moving part 150 to move the accommodation part 140 in order to change the portion to which the deflection magnetic field is applied.

When the calculation of the impedance distribution of the measurement range is finished (step S460: Yes), the image information output part 166 generates and outputs the image showing the information about inside the measurement subject 10, on the basis of the impedance distribution (step S470). The image information output part 166 generates one or more tomographic images corresponding to one or more impedance distributions, for example. Alternatively or additionally, the image information output part 166 may generate a 3D image of the inside of the measurement subject 10. For example, the image information output part 166 displays the one or more generated images on the display part 170.

Next, the determination part 230 determines a portion inside the measurement subject 10 where the magnetic resonance image is to be generated, on the basis of the one or more generated images indicating the information about inside the measurement subject 10 (step S480). The determination part 230 receives an input of the portion where the magnetic resonance image is to be generated from the user of the measurement apparatus 100 who has checked the image of the measurement subject 10 displayed on the display part 170, for example.

Next, the controller 160 acquires and outputs the magnetic resonance image of the determined portion of the measurement subject 10 (step S490). The magnetic resonance image may be acquired by a known method. For example, the static magnetic field application part 110 applies the static magnetic field of the constant magnitude in the first direction, to the measurement subject 10. Then, the deflection magnetic field application part 120 applies the deflection magnetic field having the predetermined frequency in the direction different from the first direction toward the determined portion of the measurement subject 10. The controller 160 may control the moving part 150 to move the accommodation part 140 in order to apply the deflection magnetic field to the determined portion of the measurement subject 10.

The relaxation detection element 210 detects, at the portion of the measurement subject 10, (i) the electromagnetic wave generated by applying the deflection magnetic field and (ii) the relaxation phenomenon of the generated electromagnetic wave. The MR image generation part 220 generates and outputs the magnetic resonance image that is a tomographic image inside the measurement subject, on the basis of the detection result of the generated electromagnetic wave and the relaxation phenomenon of the electromagnetic wave. The MR image generation part 220 displays the generated magnetic resonance image on the display part 170, for example. The MR image generation part 220 may display the magnetic resonance image together with the image inside the measurement subject 10 displayed by the image information output part 166.

As described above, the measurement apparatus 100 according to the present variation can determine the portion where the magnetic resonance image of the measurement subject 10 is to be generated, on the basis of the tomographic image of the impedance distribution, and can generate said magnetic resonance image. Accordingly, the measurement apparatus 100 can appropriately determine the portion to be observed inside the measurement subject 10 and can quickly generate and output the magnetic resonance image, with a simple configuration.

It should be noted that the operation described with reference to FIG. 4 is an example of the operation of the measurement apparatus 100 provided with the static magnetic field application part 110, but the disclosed embodiments are not limited thereto. The measurement apparatus 100 may generate the magnetic resonance image and then generate the tomographic image of the impedance distribution. It should be noted that, when the measurement apparatus 100 uses the geomagnetism to generate the image and the magnetic resonance image inside the measurement subject 10, it is needless to say that the same operation can be performed by (i) omitting the operation of step S420 by the static magnetic field application part 110 and (ii) applying the deflection magnetic field in a direction different from the first direction that is the direction of the magnetic field of the geomagnetism, to the portion of the measurement subject 10, for example.

The above example of the measurement apparatus 100 according to the present embodiment enables quick generation of the image of the inside of the measurement subject 10. And, an example that the measurement apparatus 100 capable of generating two types of images, the tomographic image of the impedance distribution of the measurement subject 10 and the magnetic resonance image of the measurement subject 10, switches generations of the two images has been described. Alternatively, the measurement apparatus 100 may be configured to be capable of generating only the magnetic resonance image of the measurement subject 10.

In addition, the above example of the measurement apparatus 100 according to the present embodiment, in which the moving part 150 moves the accommodation part 140 while the measurement subject 10 is fixed, has been described but the disclosed embodiments are not limited thereto. For example, the accommodation part 140 may be fixed, and the moving part 150 may move the measurement subject 10. In this case, it is desirable that the human body as the measurement subject 10 is fixed to a bed or the like, and the moving part 150 moves the bed.

Configuration Example of Detection Apparatus 400

Figure 5:
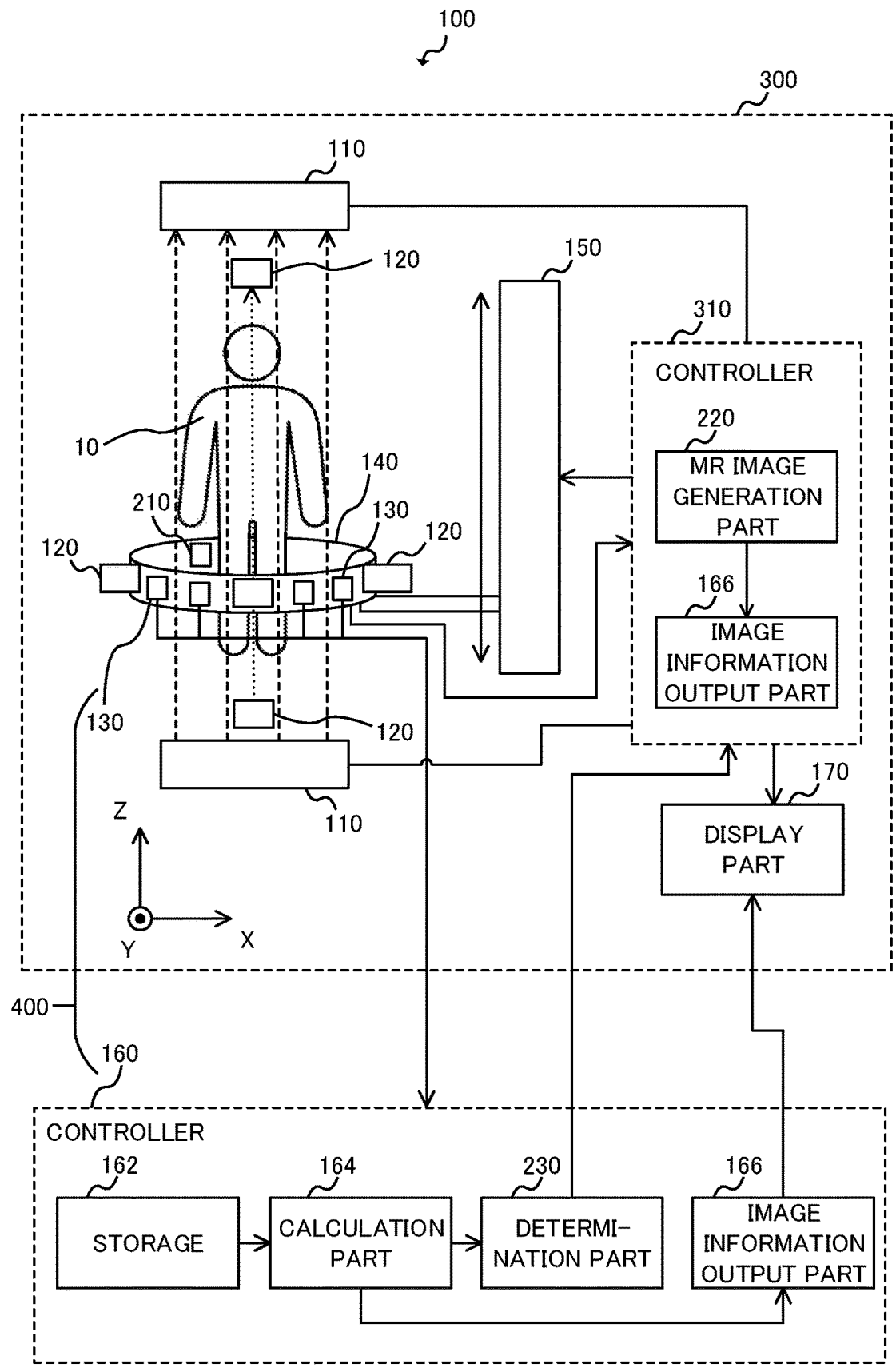
FIG. 5 shows a configuration example of a detection apparatus 400 according to the present embodiment together with an MR image measurement apparatus 300.

The above example of the measurement apparatus 100 according to the present embodiment has been described as an independent apparatus, but the apparatus is not limited thereto. The measurement apparatus 100 may be an apparatus that functions as an addition to an existing MR image measurement apparatus that outputs the magnetic resonance image. FIG. 5 shows a configuration example of the detection apparatus 400 according to the present embodiment together with the MR image measurement apparatus 300.

The MR image measurement apparatus 300 includes at least the same configuration that operates as the static magnetic field application part 110, the deflection magnetic field application part 120, the accommodation part 140, the moving part 150, the display part 170, the relaxation detection element 210, and the MR image generation part 220 according to the present embodiment. Further, the MR image measurement apparatus 300 includes a controller 310 that controls each unit in order to generate the magnetic resonance image. Since the generation of the magnetic resonance image by the MR image measurement apparatus 300 is substantially the same as the above-described operation, the description thereof will be omitted here.

The detection apparatus 400 is provided in such an MR image measurement apparatus 300. In this case, the combination of the MR image measurement apparatus 300 and the detection apparatus 400 functions as at least a part of the measurement apparatus 100 according to the present embodiment. The detection apparatus 400 includes a plurality of the magnetic field detection elements 130, and the controller 160 including the storage 162, the calculation part 164, the image information output part 166, and the determination part 230.

The detection apparatus 400 transmits and receives a control signal and the like to and from the MR image measurement apparatus 300, and generates and outputs the image showing the information about inside the measurement subject 10. Further, the detection apparatus 400 may supply the control signal for instructing the generation of the magnetic resonance image to the MR image measurement apparatus 300 on the basis of the image inside the measurement subject 10. This makes it possible to configure the measurement apparatus 100 that can acquire the information about inside the measurement subject 10 at high speed while utilizing existing equipment and the like.

The disclosed embodiments have been described above on the basis of the exemplary embodiments. The technical scope of the disclosure is not limited to the scope explained in the above embodiments, and it will be understood by those skilled in the art that various changes and modifications within the scope of the disclosure may be made. An aspect to which such changes and modifications are added can be included in the technical scope of the disclosure is contemplated from the description of the claims.

What is claimed is:

1. A measurement apparatus comprising:
   a static magnetic field application part that applies a static magnetic field in a first direction to a measurement subject;
   at least one deflection magnetic field application part that applies at least one deflection magnetic field having a predetermined frequency in a second direction different from the first direction to a portion of the measurement subject via a coil;
   a plurality of magnetic field detection elements that are arranged around the measurement subject and respectively detect a magnitude of the at least one deflection magnetic field based on an electromagnetic wave generated and propagated in a portion of the measurement subject due to an application of the at least one deflection magnetic field;
   a calculation part that calculates an impedance distribution of at least a portion of a region where the electromagnetic wave is propagated inside the measurement subject based on detection results of the plurality of magnetic field detection elements; and
   an image information output part that generates and outputs at least one image showing information about an inside of the measurement subject based on the impedance distribution of at least the portion of the region.

2. The measurement apparatus according to claim 1, wherein the static magnetic field application part is configured to apply the static magnetic field as a constant magnitude in the first direction to the measurement subject.

3. The measurement apparatus according to claim 1, wherein the static magnetic field application part is configured to change a magnitude of the static magnetic field to be applied to the measurement subject, and the calculation part calculates the impedance distribution of at least the portion of the region for each magnitude of the static magnetic field.

4. The measurement apparatus according to claim 3, wherein
   the static magnetic field application part is configured to sweep the magnitude of the static magnetic field over a predetermined magnitude range, and the image information output part generates a tomographic image of the impedance distribution for each resonance frequency with respect to atoms included in the measurement subject.

5. The measurement apparatus according to claim 1, further comprising: a relaxation detection element that detects a relaxation phenomenon of the electromagnetic wave generated in a portion of the measurement subject due to the application of the at least one deflection magnetic field; and a magnetic resonance (MR) image generation part that generates and outputs a magnetic resonance image that is a tomographic image inside the measurement subject based on a detection result of the relaxation detection element.

6. The measurement apparatus according to claim 5, further comprising:
a determination part that determines a portion inside of the measurement subject where a magnetic resonance image is to be generated based on the at least one image showing the information about the inside of the measurement subject generated by the image information output part.

7. The measurement apparatus according to claim 1, wherein
the deflection magnetic field application part includes a plurality of magnetic field generation coils, and applies a plurality of the deflection magnetic fields directed in a plurality of directions different from the first direction toward the portion of the measurement subject.

8. The measurement apparatus according to claim 7, further comprising:
an accommodation part that has a ring shape or a partial ring shape surrounding the measurement subject and accommodates a plurality of the deflection magnetic field application parts; and
a moving part that moves the accommodation part in a predetermined direction while maintaining a direction of the deflection magnetic field generated by the plurality of deflection magnetic field application parts with respect to the measurement subject.

9. The measurement apparatus according to claim 8, wherein
the accommodation part accommodates at least some of the plurality of magnetic field detection elements.

10. A detection apparatus provided in an MR image measurement apparatus, the MR image measurement apparatus including:
a static magnetic field application part that applies a static magnetic field in a first direction to a measurement subject,
at least one deflection magnetic field application part that applies at least one deflection magnetic field having a predetermined frequency in a second direction different from the first direction toward a portion of the measurement subject via a coil,
a relaxation detection element that detects an electromagnetic wave generated due to an application of the deflection magnetic field and a relaxation phenomenon of the generated electromagnetic wave in a portion of the measurement subject, and
an MR image generation part that generates and outputs a magnetic resonance image that is a tomographic image of an inside of the measurement subject based on a detection result of the relaxation detection element,
the detection apparatus comprising:
a plurality of magnetic field detection elements that are arranged around the measurement subject and respectively detect a magnitude of the at least one deflection magnetic field based on an electromagnetic wave generated and propagated in portion of the measurement subject due to an application of the at least one deflection magnetic field;
a calculation part that calculates an impedance distribution of at least a portion of a region where the electromagnetic wave is propagated inside the measurement subject based on detection results of the plurality of magnetic field detection elements; and
an image information output part that generates and outputs at least one image showing information about an inside of the measurement subject based on the impedance distribution of at least the portion of the region.

11. The detection apparatus according to claim 10, further comprising:
a determination part that determines a portion inside of the measurement subject where a magnetic resonance image is to be generated based on the at least one image showing the information about the inside of the measurement subject generated by the image information output part.

12. The detection apparatus according to claim 10, wherein the static magnetic field application part is configured to apply the static magnetic field as a constant magnitude in the first direction to the measurement subject.

13. The detection apparatus according to claim 10, wherein the static magnetic field application part is configured to change a magnitude of the static magnetic field to be applied to the measurement subject, and the calculation part calculates the impedance distribution of at least the portion of the region for each magnitude of the static magnetic field.

14. A measurement method comprising the steps of:
applying a static magnetic field in a first direction to a measurement subject;
applying at least one deflection magnetic field having a predetermined frequency in a second direction different from the first direction to a portion of the measurement subject via a coil;
detecting a magnitude of the at least one deflection magnetic field based on an electromagnetic wave generated and propagated in a portion of the measurement subject due to an application of the at least one deflection magnetic field, around the measurement subject;
calculating an impedance distribution of at least a portion of a region where the electromagnetic wave is propagated inside the measurement subject based on a detection result of the propagated electromagnetic wave; and
generating and outputting at least one image showing information about an inside of the measurement subject based on the impedance distribution of at least the portion of the region.

15. The measurement method according to claim 14, further comprising:
determining a portion inside the measurement subject where a magnetic resonance image is to be generated based on the generated at least one image showing the information about the inside of the measurement subject;
applying the static magnetic field to the measurement subject;
applying the at least one deflection magnetic field having a predetermined frequency in a direction different from the first direction to a portion of the measurement subject via a coil;

detecting the electromagnetic wave generated due to an application of the at least one deflection magnetic field and a relaxation phenomenon of the generated electromagnetic wave in a portion of the measurement subject; and generating and outputting a magnetic resonance image that is a tomographic image inside the measurement subject based on the detection result of the generated electromagnetic wave and the relaxation phenomenon of the electromagnetic wave.

16. The measurement method according to claim 14, wherein applying the static magnetic field in the first direction to the measurement subject includes applying the static magnetic field as a constant magnitude in the first direction to the measurement subject.

17. The measurement method according to claim 14, wherein applying the static magnetic field in the first direction to the measurement subject includes changing a magnitude of the static magnetic field to be applied to the measurement subject, and calculating the impedance distribution of the at least the portion of the region where the electromagnetic wave is propagated inside the measurement subject includes calculating the impedance distribution for each magnitude of the static magnetic field.

* * * * *